United States Patent
Mizuochi et al.

(10) Patent No.: US 10,995,172 B2
(45) Date of Patent: May 4, 2021

(54) SELF-ORGANIZED FILM-FORMING COMPOSITION FOR USE IN FORMING A MICRO-PHASE-SEPARATED PATTERN

(71) Applicant: NISSAN CHEMICAL CORPORATION, Tokyo (JP)

(72) Inventors: Ryuta Mizuochi, Toyama (JP); Yasunobu Someya, Toyama (JP); Hiroyuki Wakayama, Toyama (JP); Rikimaru Sakamoto, Toyama (JP)

(73) Assignee: NISSAN CHEMICAL CORPORATION, Tokyo (JP)

(*) Notice: Subject to any disclaimer, the term of this patent is extended or adjusted under 35 U.S.C. 154(b) by 19 days.

(21) Appl. No.: 16/478,018

(22) PCT Filed: Jan. 16, 2018

(86) PCT No.: PCT/JP2018/000904
§ 371 (c)(1),
(2) Date: Jul. 15, 2019

(87) PCT Pub. No.: WO2018/135456
PCT Pub. Date: Jul. 26, 2018

(65) Prior Publication Data
US 2020/0123298 A1    Apr. 23, 2020

(30) Foreign Application Priority Data
Jan. 19, 2017  (JP) .............................. JP2017-007148

(51) Int. Cl.
| | |
|---|---|
| *B05D 5/00* | (2006.01) |
| *H01L 21/027* | (2006.01) |
| *C08F 293/00* | (2006.01) |
| *B05D 3/00* | (2006.01) |
| *C08F 299/02* | (2006.01) |

(52) U.S. Cl.
CPC .......... *C08F 293/005* (2013.01); *B05D 3/007* (2013.01); *B05D 5/00* (2013.01); *C08F 299/022* (2013.01); *H01L 21/027* (2013.01); *B05D 2350/60* (2013.01); *B05D 2518/10* (2013.01)

(58) Field of Classification Search
CPC .. C08F 293/005; C08F 299/022; B05D 3/007; B05D 5/00; B05D 2350/60; B05D 2518/10; H01L 21/027
USPC ........................................................ 524/505
See application file for complete search history.

(56) References Cited

U.S. PATENT DOCUMENTS

| | | | |
|---|---|---|---|
| 2004/0248338 A1 | 12/2004 | Sirringhaus et al. | |
| 2013/0266780 A1 | 10/2013 | Ellison et al. | |
| 2013/0344242 A1* | 12/2013 | Willson | B05D 7/52 |
| | | | 427/240 |
| 2014/0287266 A1* | 9/2014 | Watanabe | G11B 5/855 |
| | | | 428/800 |
| 2015/0322219 A1 | 11/2015 | Someya et al. | |
| 2016/0311959 A1* | 10/2016 | Lee | C07C 43/215 |

FOREIGN PATENT DOCUMENTS

| | | |
|---|---|---|
| CN | 1541426 A | 10/2004 |
| CN | 104254557 A | 12/2014 |
| CN | 104854205 A | 8/2015 |
| EP | 3 078 654 A1 | 10/2016 |
| JP | 2014-186773 A | 10/2014 |
| JP | 2015-5750 A | 1/2015 |
| JP | 2015-170723 A | 9/2015 |
| JP | 2017-501267 A | 1/2017 |
| WO | 2016/068261 A1 | 5/2016 |

* cited by examiner

*Primary Examiner* — Kelechi C Egwim
(74) *Attorney, Agent, or Firm* — Oliff PLC

(57) ABSTRACT

A self-assembled film-forming composition for orthogonally inducing, with respect to a substrate, a microphase separation structure in a layer including a block copolymer, in the whole surface of a coating film, even at high heating temperatures at which arrangement failure of the microphase separation of the block copolymer occurs. The self-assembled film-forming composition includes a block copolymer, and at least two solvents having different boiling points as a solvent. The block copolymer is obtained by bonding: a non-silicon-containing polymer having, as a structural unit, styrene, a derivative thereof, or a structure derived from a lactide; and a silicon-containing polymer having, as a structural unit, styrene substituted with silicon-containing groups. The solvent includes: a low boiling point solvent (A) having a boiling point of 160° C. or lower; and a high boiling point solvent (B) having a boiling point of 170° C. or higher.

11 Claims, 1 Drawing Sheet

SELF-ORGANIZED FILM-FORMING COMPOSITION FOR USE IN FORMING A MICRO-PHASE-SEPARATED PATTERN

TECHNICAL FIELD

The present invention relates to a self-organized film-forming composition for use in forming a micro-phase-separated pattern, preferably a self-organized film-forming composition for use in forming a micro-phase-separated pattern in a semiconductor device production process.

BACKGROUND ART

In recent years, as large scale integrated circuits (LSIs) are being further scaled down, techniques for fabrication of ultrafine microstructures have been demanded. For meeting such demands, an attempt has been made to form micro-patterns utilizing a phase-separated structure formed by self-organization of a block copolymer, in which polymers incompatible with each other are bound. For example, a method for forming a pattern has been proposed in which an underlayer film-forming composition is applied onto a substrate to form an underlayer film containing the composition, and a self-organized film containing a block copolymer, in which two or more polymers bonded to each other, is formed on the surface of the underlayer film, the block copolymer in the self-organized film is caused to suffer phase separation, and a phase of at least one polymer of the polymers constituting the block copolymer is selectively removed to form a pattern.

Patent Literature 1 discloses a method for forming a pattern using a composition containing a first polymer which is a block copolymer, and a second polymer having a surface free energy smaller than that of the block copolymer, comprising the steps of: forming a coating film, in which the second polymer is locally present in the surface layer region; causing at least part of the coating film to suffer phase separation in substantially the vertical direction to form a self-organized film; and removing a partial phase of the self-organized film.

However there still is a problem of defective orientation caused in micro-phase separation of a layer containing a block copolymer at high heat temperatures. Thus, a technique has been desired for allowing a layer containing a block copolymer to make a micro-phase-separated structure perpendicular to a substrate over the entire coating film even at such high temperatures.

CITATION LIST

Patent Literature

Patent Literature 1: JP 2015-170723 A

SUMMARY OF INVENTION

Technical Problem

Accordingly, an object of the present invention is to provide a self-organized film-forming composition for allowing a layer containing a block copolymer to make a micro-phase-separated structure perpendicular to a substrate over the entire coating film even at such high heat temperatures that would cause defective orientation in micro-phase separation of the block copolymer. Another object of the present invention is to provide a method for producing a phase-separated pattern of a block copolymer and a method for producing a semiconductor device, which use the above composition.

Solution to Problem

The present invention embraces the following.

[1] A self-organized film-forming composition comprising a block copolymer, and at least two solvents having different boiling points as solvents,
the block copolymer being a block copolymer in which a silicon-containing polymer having as a structural unit styrene substituted with a silicon-containing group and either a silicon-non-containing polymer having as a structural unit a structure derived from a lactide or a silicon-non-containing polymer having as a structural unit styrene optionally substituted with an organic group or a derivative thereof are bound,
the solvents comprising a low boiling-point solvent (A) having a boiling point of not higher than 160° C. and a high boiling-point solvent (B) having a boiling point of not lower than 170° C.

[2] The composition according to [1], wherein the high boiling-point solvent (B) is contained in an amount of 0.3 to 2.0% by weight, based on the total weight of the solvents contained in the composition.

[3] A method for producing a phase-separated pattern of a block copolymer, comprising the steps of:
(1) forming a block copolymer layer on a substrate using the self-organized film-forming composition according to [1] or [2]; and
(2) causing the block copolymer layer formed on the substrate to suffer phase separation,
wherein the block copolymer is a block copolymer in which a silicon-containing polymer having as a structural unit styrene substituted with a silicon-containing group and either a silicon-non-containing polymer having as a structural unit a structure derived from a lactide or a silicon-non-containing polymer having as a structural unit styrene optionally substituted with an organic group or a derivative thereof are bound.

[4] The method according to [3], further comprising the step of forming an underlayer film on the substrate before step (1).

[5] The method according to [3], further comprising the step of forming an upper layer film on the block copolymer layer between step (1) and step (2).

[6] A method for producing a semiconductor device, comprising the steps of:
(1) forming a block copolymer layer on a substrate using the self-organized film-forming composition according to [1] or [2];
(2) causing the block copolymer layer formed on the substrate to suffer phase separation;
(3) subjecting the phase-separated block copolymer layer to etching; and
(4) subjecting the substrate to etching,
wherein the block copolymer is a block copolymer in which a silicon-containing polymer having as a structural unit styrene substituted with a silicon-containing group and either a silicon-non-containing polymer having as a structural unit a structure derived from a lactide or a silicon-non-containing polymer having as a structural unit styrene optionally substituted with an organic group or a derivative thereof are bound.

[7] A method for causing a block copolymer to suffer self-organization using a self-organized film-forming composition which comprises:

a block copolymer in which a silicon-containing polymer having as a structural unit styrene substituted with a silicon-containing group and either a silicon-non-containing polymer having as a structural unit a structure derived from a lactide or a silicon-non-containing polymer having as a structural unit styrene optionally substituted with an organic group or a derivative thereof are bound; and at least a low boiling-point solvent (A) having a boiling point of not higher than 160° C. and a high boiling-point solvent (B) having a boiling point of not lower than 170° C. as solvents.

Advantageous Effects of Invention

Even at such a baking temperature that would cause defective orientation in micro-phase separation using a composition of a silicon-containing block copolymer in a single solvent, use of the self-organized film composition of the present invention permits allowing a layer containing a block copolymer to make a micro-phase-separated structure perpendicular to a substrate over the entire coating film.

DESCRIPTION OF EMBODIMENTS

Figure 1:
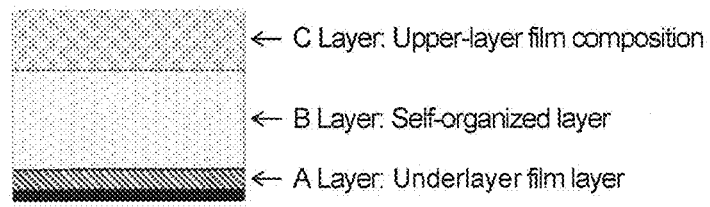
FIG. 1 A view showing the arrangement of a substrate, an underlayer film (A layer), a self-organized film (B layer), and an upper layer film composition (C layer).

In the present invention, there are provided:

a self-organized film-forming composition comprising a block copolymer, and at least two solvents having different boiling points as solvents, the block copolymer being a block copolymer in which a silicon-non-containing polymer having as a structural unit styrene or a derivative thereof or a structure derived from a lactide and a silicon-containing polymer having as a structural unit styrene substituted with a silicon-containing group are bound, the at least two solvents comprising a low boiling-point solvent (A) having a boiling point of not higher than 160° C. and a high boiling-point solvent (B) having a boiling point of not lower than 170° C., a method for causing a block copolymer to suffer self-organization using the above-mentioned self-organized film-forming composition, and a method for producing a phase-separated pattern of a block copolymer, and a method for producing a semiconductor device.

These are individually described below.

1. Self-Organized Film-Forming Composition 1.1. Solvent

The self-organized film-forming composition of the present invention comprises at least two solvents having different boiling points as solvents, wherein at least one of the solvents is selected from a low boiling-point solvent (A) having a boiling point of not higher than 160° C., and at least the other one is selected from a high boiling-point solvent (B) having a boiling point of not lower than 170° C.

The boiling, point referred to herein refers to a boiling point as measured under 1 atm.

Low boiling-point solvent (A) and high boiling-point solvent (B) used in the self-organized film-forming, composition of the present invention may be selected from, for example, the solvents shown below.

aliphatic hydrocarbon solvents, such as n-pentane, i-pentane, n-hexane, i-hexane, n-heptane, i-heptane, 2,2,4-trimethylpentane, n-octane, i-octane, cyclohexane, and methylcyclohexane;

aromatic hydrocarbon solvents, such as benzene, toluene, xylene, ethylbenzene, trimethylbenzene, methylethylbenzene, n-propylbenzene, i-propylbenzene, diethylbenzene, i-butylbenzene, triethylbenzene, di-i-propylbenzene, n-amylnaphthalene, and trimethylbenzene;

monoalcohol solvents, such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethylcarbinol, diacetone alcohol, and cresol;

polyhydric alcohol solvents, such as ethylene glycol, propylene glycol, 1,3-butylene glycol, pentanediol-2,4, 2-methylpentanediol-2,4, hexanediol-2,5, heptanediol-2,4, 2-ethylhexanediol-1,3, diethylene glycol, dipropylene glycol, triethylene glycol, tripropylene glycol, and glycerol;

ketone solvents, such as acetone, methyl ethyl ketone, methyl n-propyl ketone, methyl n-butyl ketone, diethyl ketone, methyl i-butyl ketone, methyl n-pentyl ketone, ethyl n-butyl ketone, methyl n-hexyl ketone, di-i-butyl ketone, trimethylnonanone, cyclohexanone, methylcyclohexanone, 2,4-pentanedione, acetonylacetone, diacetone alcohol, acetophenone, and fenchone;

ether solvents, such as ethyl ether, i-propyl ether, n-butyl ether, n-hexyl ether, 2-ethylhexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxy triglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyltetrahydrofuran;

ester solvents, such as diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, and diethyl phthalate;

nitrogen-containing solvents, such as N-methylformamide, N,N-dimethylformamide, N,N-diethylformamide, acetamide, N-methylacetamide, N,N-dimethylacetamide, N-methylpropionamide, and N-methylpyrrolidone; and sulfur-containing solvents, such as dimethyl sulfide, diethyl sulfide, thiophene, tetrahydrothiophene, dimethyl sulfoxide, sulfolane, and 1,3-propane sultone.

As the low boiling-point solvent (A) having a boiling point of not higher than 160° C., for example, propylene glycol monomethyl ether acetate (boiling point: 146° C.), n-butyl acetate (boiling point: 126° C.), and methyl isobutyl ketone (boiling point: 116° C.) are preferred.

As the high boiling-point solvent (B) having a boiling point of not lower than 170° C., for example, N-methylpyrrolidone (boiling point: 204° C.), diethylene glycol monomethyl ether (boiling point: 193° C.), N,N-dimethylisobutylamide (boiling point: 175° C.), 3-methoxy-N,N'-dimethylpropanamide (boiling point: 215° C.), and γ-butyrolactone (boiling point: 204° C.) are preferred.

For each of low boiling-point solvent (A) and high boiling-point solvent (B), two or more species may be selected and used in combination.

In a preferred embodiment, high boiling-point solvent (B) is contained in an amount of 0.3 to 2.0% by weight, based on the total weight of the solvents contained in the composition. It is most preferred that high boiling-point solvent (B) is contained in an amount of 0.5 to 1.5% by weight, based on the total weight of the solvents contained in the composition.

1.2. Block Copolymer

With respect to the block polymer, examples of combinations of blocks include AB, ABAB, ABA, and ABC.

A method for synthesizing the block copolymer would be to obtain the same by living radical polymerization or living cationic polymerization, of which the polymerization process is comprised of only an initiation reaction and a propagation reaction, without being accompanied by a side reaction that deactivates the propagation end. The propagation end can maintain a propagation activating reaction during the polymerization reaction. By inhibiting chain transfer, polymer (A) having a uniform length can be obtained. By adding another monomer (b) while using the propagation end of polymer (A), the polymerization proceeds in the presence of monomer (b) to form a block copolymer (AB).

For example, when two types of blocks, i.e., blocks A and B are present, the molar ratio of polymer chain (A) and polymer chain (B) can be 1:9 to 9:1, preferably 3:7 to 7:3.

The volume ratio in the block copolymer used in the present invention ranges, for example, from 30:70 to 70:30.

Homopolymer A or B is a polymerizable compound having at least one radically polymerizable reactive group (vinyl group or vinyl group-containing organic group).

The weight average molecular weight Mw of the block copolymer used in the present invention ranges preferably from 1,000 to 100,000, or from 5,000 to 100,000. When the weight average molecular weight Mw of the block copolymer is less than 1,000, the application properties to the substrate are likely to be poor, and, when the weight average molecular weight Mw of the block copolymer is 100,000 or more, the solubility of the block copolymer in a solvent, is likely to be poor.

The polydisperse degree (Mw/Mn) of the block copolymer in the present invention ranges preferably from 1.00 to 1.50, especially preferably from 1.00 to 1.20.

The block copolymer suitably used in the present invention is a block copolymer in which either a silicon-non-containing polymer having as a structural unit styrene optionally substituted with an organic group or a silicon-non-containing polymer having as a structural unit a structure derived from a lactide and a silicon-containing polymer having as a structural unit styrene substituted with a silicon-containing group are bound.

Of these, a combination of a silylated polystyrene derivative and a polystyrene derivative polymer, or a combination of a silylated polystyrene derivative polymer and polylactide is preferred.

Of these, a combination of a silylated polystyrene derivative having a substituent at the 4-position and a polystyrene derivative polymer having a substituent at the 4-position, or a combination of a silylated polystyrene derivative polymer having a substituent at the 4-position and polylactide is preferred.

More preferred specific examples of block copolymers include a combination of poly(trimethylsilylstyrene) and polymethoxystyrene, a combination of polystyrene and poly(trimethylsilylstyrene), and a combination of poly(trimethylsilylstyrene) and poly(D,L-lactide).

More preferred specific examples of block copolymers include a combination of poly(4-trimethylsilylstyrene) and poly(4-methoxystyrene), a combination of polystyrene and poly(4-trimethylsilylstyrene), and a combination of poly(4-trimethylsilylstyrene) and poly(D,L-lactide).

Most preferred specific examples of block copolymers include a poly(4-methoxystyrene)/poly(4-trimethylsilylstyrene) copolymer and a polystyrene/poly(4-trimethylsilylstyrene) copolymer.

1.3. Preparation of the Self-Organized Film-Forming Composition

The self-organized film-forming composition may have a solid content of 0.1 to 10% by mass, or 0.1 to 5% by mass, or 0.1 to 3% by mass. The solid content refers to the content of the substances left behind the removal of the solvent from the film-forming composition.

The proportion of the block copolymer in the solid content may be 30 to 100% by mass, or 50 to 100% by mass, or 50 to 90% by mass, or 50 to 80% by mass.

Two or three or more types of block may be present in the block copolymer. Further, two or three or more blocks may be present in the block copolymer.

It is possible to cause a block copolymer to suffer self-organization using the self-organized film-forming composition of the present invention, which comprises:

a block copolymer in which a silicon-non-containing polymer having as a structural unit styrene or a derivative thereof or a structure derived from a lactide and a silicon-containing polymer having as a structural unit styrene substituted with a silicon-containing group are bound; and at least a low boiling-point solvent (A) having a boiling point of not higher than 160° C. and a high boiling-point solvent (B) having a boiling point of not lower than 170° C. as solvents.

2. Method for Producing Phase-Separated Pattern of Block Copolymer

The method for producing a phase-separated pattern of a block copolymer of the present invention comprises the steps of: (1) forming a block copolymer layer on a substrate using the self-organized film-forming composition of the present invention, wherein the block copolymer is a block copolymer in which a silicon-non-containing polymer having as a structural unit styrene or a derivative thereof or a structure derived from a lactide and a silicon-containing polymer having as a structural unit styrene substituted with a silicon-containing group are bound; and (2) causing the block copolymer layer formed on the substrate to suffer phase separation.

The method may further comprise the step of forming an underlayer film on the substrate before step (1).

Further, the method may further comprise the step of forming an upper layer film on the block copolymer layer between step (1) and step (2).

Hereinbelow, explanation is made in the order of;
[1] step of forming an underlayer film on a substrate,
[2] step of forming a block copolymer layer,
[3] step of forming an upper layer film, and
[4] step of causing the block copolymer layer to suffer phase separation.

[1] Step of Forming Underlayer Film on Substrate
[1.1] Substrate

The substrate is comprised of a material selected from the group consisting of silicon, silicon oxide, glass, surface-modified glass, a plastic, a ceramic, a transparent material, a flexible material, a material used in roll-to-roll processing, and combinations thereof. Preferred is a silicon wafer, quartz, glass, or a plastic, and more preferred is a silicon wafer. The semiconductor substrate is representatively a silicon wafer, but an SOI (silicon on insulator) substrate, or a compound semiconductor wafer, such as gallium arsenide (GaAs), indium phosphide (InP), or gallium phosphide (GaP), may be used. A semiconductor substrate having formed thereon an insulating film, such as a silicon oxide film, a nitrogen-containing silicon oxide film (SiON film), or a carbon-containing silicon oxide film (SiOC film), may also be used, and, in such a case, the underlayer film-forming composition of the present invention is applied onto the insulating film.

[1.2] Underlayer Film-Forming Composition

The copolymer contained in the underlayer film-forming composition of the present invention for use in causing a layer comprising a block copolymer formed on a substrate to suffer phase separation can be produced by subjecting the below-mentioned monomers to copolymerization by a method commonly used, for example, bulk polymerization, solution polymerization, suspension polymerization, or emulsion polymerization so that the copolymerization ratio becomes an appropriate molar ratio. Solution polymerization is especially preferred, and, in this case, for example, polymerization can be conducted by adding desired monomers to a solvent having added an additive and a polymerization initiator.

In the present invention, the copolymer means a copolymer which is not limited to a compound of high molecular weight, and accordingly, a monomer is excluded from the copolymer, but an oligomer is not excluded.

Further, the below-mentioned monomers may be used alone or in combination of two or more.

The copolymers and the like that can be suitably used in the present invention are described below.
(1) Synthesis of Copolymer
(1.1) Monomer
(1.1.1) Styrene Compound Containing a Tert-Butyl Group The aromatic ring of styrene is substituted with one or more tert-butyl groups. The number of tert-butyl group ranges from 1 to 5.

Preferred is a compound represented by formula (1'):

[Chemical formula 1]

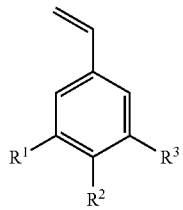

Formula (1')

wherein one or two of $R^1$ to $R^3$ are a tert-butyl group.
More preferred is 4-tert-butylstyrene.
(1.1.2) Aromatic Group-Containing Vinyl Compound Containing No Hydroxy Group The aromatic group-containing vinyl compound containing no hydroxy group in the present invention is an aromatic group-containing vinyl compound that is different from the above-mentioned styrene compound containing a tert-butyl group.

Preferred are compounds represented by formulae (4'-1) and (4'-2):

[Chemical formula 2]

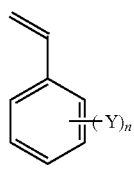

Formula (4'-1)

[Chemical formula 3]

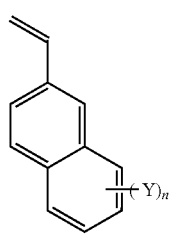

Formula (4'-2)

wherein, in formulae (4'-1) and (4'-2), Y represents a halogen atom, an alkyl group, an alkoxy group, a cyano group, an amide group, an alkoxycarbonyl group, or a thioalkyl group, and n represents an integer of 0 to 7.

With respect to the "halogen atom", preferred are a fluorine atom, a chlorine atom, a bromine atom, and an iodine atom, and especially preferred are a fluorine atom and a chlorine atom.

The "alkyl group" in the present invention includes a linear, branched, or cyclic alkyl group.

Examples of linear, branched, or cyclic saturated alkyl groups include a methyl group, an ethyl group, a n-propyl group, an i-propyl group, a cyclopropyl group, a n-butyl group, an i-butyl group, a s-butyl group, a t-butyl group, a cyclobutyl group, a 1-methyl-cyclopropyl group, a 2-methyl-cyclopropyl group, a n-pentyl group, a n-hexyl group, a n-heptyl group, a n-octyl group, a n-nonyl group, a n-decanyl group, a n-undecanyl group, a n-dodecanyl group, a n-tridecanyl group, a n-tetradecanyl group, a n-pentadecanyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, a n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group. The number of carbon atoms of the alkyl group is 1 to 3, 1 to 6, 1 to 8, 1 to 10, or 1 to 15 in the order of preference.

The alkoxy group includes a group corresponding to the above-mentioned alkyl group having an ether oxygen atom (—O—) bonded to the carbon atom at the end thereof. Examples of such alkoxy groups include a methoxy group, an ethoxy group, a n-propoxy group, an i-propoxy group, a cyclopropoxy group, a n-butoxy group, an i-butoxy group, a s-butoxy group, a t-butoxy group, a cyclobutoxy group, a 1-methyl-cyclopropoxy group, a 2-methyl-cyclopropoxy group, a n-pentoxy group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, a 1,1-diethyl-n-propoxy group, a cyclopentoxy group, a 1-methyl-cyclobutoxy group, a 2-methyl-cyclobutoxy group, a 3-methyl-cyclobutoxy group, a 1,2-dimethyl-cyclopropoxy group, a 2,3-dimethyl-cyclopropoxy group, a 1-ethyl-cyclopropoxy group, and a 2-ethyl-cyclopropoxy group. The structure of the alkoxy group is preferably a linear chain or a branched chain. The number of carbon atoms of the alkoxy group is 1 to 3, 1 to 6, 1 to 8, 1 to 10, or 1 to 15 in the order of preference.

The amide group includes a group of —CONR'R" wherein R' and R" are a hydrogen atom or the above-mentioned alkyl group.

The alkoxycarbonyl group includes a group corresponding to the above-mentioned alkoxy group having a carbonyl group (—CO—) bonded to the carbon atom at the end thereof. The structure of the alkoxycarbonyl group is preferably a linear chain or a branched chain. Examples of such alkoxycarbonyl groups include a methoxycarbonyl group, an ethoxycarbonyl group, a n-propoxycarbonyl group, an isopropoxycarbonyl group, a n-butoxycarbonyl group, an isobutoxycarbonyl group, a sec-butoxycarbonyl group, a tert-butoxycarbonyl group, a n-pentyloxycarbonyl group, and a n-hexyloxycarbonyl group.

The thioalkyl group includes a group corresponding to the above-mentioned alkoxy group having —S— in place of —O—. Examples of such thioalkyl groups include a methylthio group, an ethylthio group, a n-propylthio group, an i-propylthio group, a n-butylthio group, an i-butylthio group, a s-butylthio group, a t-butylthio group, a 2-methylbutylthio group, a n-pentylthio group, and a n-hexoxy group.

A more preferred aromatic group-containing vinyl compound containing no hydroxy group is 2-vinylnaphthalene.

(1.1.3) Compound Containing (Meth)Acryloyl Group and Containing No Hydroxy Group The "(meth)acryloyl group" is an expression for referring to both an acryloyl group and a methacryloyl group. The acryloyl group indicates a group represented by $CH_2=CH-CO-$, and the methacryloyl group indicates a group represented by $CH_2=C(R)-CO-$ (wherein R is, e.g., a hydrocarbon group).

Preferred are compounds represented by formulae (5'-1) and (5'-2):

[Chemical formula 4]

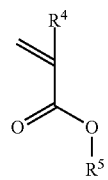

(Formula 5'-1)

[Chemical formula 5]

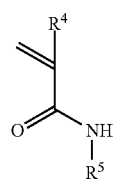

(Formula 5'-2)

wherein, in formulae (5'-1) and (5'-2), each of $R^4$ and $R^5$ independently represents a hydrogen atom, an alkoxy group having 1 to 5 carbon atoms, a linear, branched, or cyclic alkyl group having 1 to 10 carbon atoms, which is optionally substituted with a halogen atom, a benzyl group, or an anthrylmethyl group.

The "alkoxy group", "halogen atom", and "alkyl group" are as described above.

Examples of compounds containing (a)an (meth)acryloyl group and containing no hydroxy group include methyl (meth)acrylate, ethyl (meth)acrylate, n-hexyl (meth)acrylate, isopropyl (meth)acrylate, cyclohexyl (meth)acrylate, benzyl (meth)acrylate, anthrylmethyl (meth)acrylate, 2,2,2-trifluoroethyl (meth)acrylate, 2,2,2-trichloroethyl (meth)acrylate, 2-bromoethyl (meth)acrylate, 2-methoxyethyl (meth)acrylate, butoxy(2-ethyl) (meth)acrylate, 2-methyl-2-adamantyl (meth)acrylate, (meth)acrylamide, N-methyl (meth)acrylamide, N-ethyl(meth)acrylamide, N-benzyl (meth)acrylamide, and N-anthryl(meth)acrylamide. More preferred is benzyl methacrylate.

(1.1.4) Crosslink-Forming Group-Containing Compound

There is no particular limitation to the crosslink-forming group as long as it is a group capable of forming a chemical bond between the molecules. The crosslink-forming group may be, for example, a hydroxy group, an epoxy group, a protected hydroxy group, or a protected carboxyl group. The compound may contain any number of crosslink-forming groups in the molecule.

Examples of hydroxy groups include a vinyl group-containing hydroxy group derived from, for example, a hydroxyalkyl (meth)acrylate or vinyl alcohol, and a phenolic hydroxy group such as that of hydroxystyrene. The alkyl groups include the above alkyl groups, such as a methyl group, an ethyl group, a propyl group, an isopropyl group, and a butyl group. In the present specification, the "(meth)acrylate" refers to both methacrylate and acrylate.

Examples of epoxy groups include a vinyl group-containing epoxy group derived from, for example, epoxy (meth)acrylate or glycidyl (meth)acrylate.

The protected hydroxy group includes a group corresponding to a hydroxy group of hydroxystyrene, which is protected by a tertiarybutoxy (tert-butoxy) group. Further, it includes a protected hydroxy group obtained by reacting a phenolic hydroxy group of, for example, hydroxystyrene with a vinyl ether compound, and a protected hydroxy group obtained by reacting an alcoholic hydroxy group of, for example, hydroxyethyl methacrylate with a vinyl ether compound. Examples of vinyl ether compounds include aliphatic vinyl ether compounds having an alkyl chain having 1 to 10 carbon atoms and a vinyl ether group, such as methyl vinyl ether, ethyl vinyl ether, isopropyl vinyl ether, normalbutyl vinyl ether, 2-ethylhexyl vinyl ether, tert-butyl vinyl ether, and cyclohexyl vinyl ether, and cyclic vinyl ether compounds, such as 2,3-dihydrofuran, 4-methyl-2,3-dihydrofuran, and 2,3-dihydro-4H-pyran.

The protected carboxyl group includes a protected carboxyl group obtained by reacting a carboxyl group of (meth)acrylic acid or vinylbenzoic acid with a vinyl ether compound. Examples of the vinyl ether compound used for the protected group include the above vinyl ether compounds.

Preferred are compounds represented by formulae (2'-1), (2'-2), (3'-1), and (3'-2):

[Chemical formula 6]

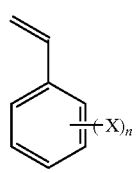

Formula (2'-1)

[Chemical formula 7]

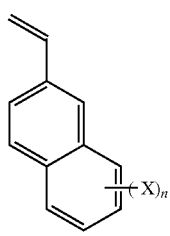

Formula (2'-2)

wherein, in formulae (2'-1) and (2'-2), each of n quantity of X independently represents a hydroxy group, a halogen atom, an alkyl group, an alkoxy group, a cyano group, an amide group, an alkoxycarbonyl group, or a thioalkyl group, with which the aromatic ring is substituted, and n represents an integer of 1 to 7, and at least one of X is a hydroxy group.

[Chemical formula 8]

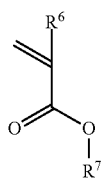

(Formula 3'-1)

[Chemical formula 9]

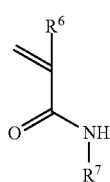

(Formula 3'-2)

wherein, in formulae (3'-1) and (3'-2), $R^6$ represents a hydrogen atom, a linear, branched, or cyclic alkyl group having 1 to 10 carbon atoms, which is optionally substituted with a hydroxy group and/or a halogen atom, or a hydroxyphenyl group, and $R^7$ represents a linear, branched, or cyclic alkyl group having 1 to 10 carbon atoms, which has a hydroxy group, and is optionally substituted with a halogen atom, or a hydroxyphenyl group.

The "halogen atom", "alkyl group", "alkoxy group", "amide group", "alkoxycarbonyl group", and "thioalkyl group" are as described above.

More preferred are 2-hydroxypropyl methacrylate, 2-hydroxyethyl methacrylate, N-(4-hydroxyphenyl)methacrylamide, 2-hydroethyl acrylate, 2-hydroxypropyl methacrylate, and 4-hydroxybutyl (meth)acrylate.

The above-mentioned monomers can be produced by a method commonly used, or are commercially available.

(1.2) Polymerization Initiator

With respect to the polymerization initiator, an organic peroxide or a diazo compound may be used.

Examples of organic peroxides include diacyl peroxides, such as diacetyl peroxide, diisobutyl peroxide, didecanoyl peroxide, benzoyl peroxide, and succinyl peroxide; peroxydicarbonates, such as diisopropyl peroxydicarbonate, di-2-ethylhexyl peroxydicarbonate, and diallyl peroxydicarbonate; peroxy esters, such as tert-butyl peroxyisobutyrate, tert-butyl neodecanoate, and cumene peroxyneodecanoate; and sulfonate peroxides, such as acetylcyclohexylsulfonyl peroxide.

Examples of diazo compounds include 2,2'-azobisisobutyronitrile, 4,4'-azobis(4-cyanovaleric acid), 2,2'-azobis(4-methoxy-2,4-dimethoxyvaleronitrile), and 2,2'-azobis(2-cyclopropylpropionitrile).

For the purpose of terminating the polymerization in a short time, a compound having a decomposition half-life of 10 hours or less at 80° C. is preferred, and, of the above compounds, preferred compounds are benzoyl peroxide and 2,2'-azobisisobutyronitrile.

The amount of the polymerization initiator used is generally 0.0001 to 0.2 equivalent, preferably 0.0005 to 0.1 equivalent, relative to the all monomers used.

(1.3) Solvent

There is no particular limitation to the solvent used in the present invention as long as it does not participate in the polymerization reaction and is compatible with the polymer. Specifically, usable are an aromatic hydrocarbon, such as benzene, toluene, or xylene; an alicyclic hydrocarbon, such as cyclohexane; an aliphatic hydrocarbon, such as n-hexane or n-octane; a ketone, such as acetone, methyl ethyl ketone, or cyclohexanone; an ether, such as tetrahydrofuran or dioxane; an ester, such as ethyl acetate or butyl acetate; an amide, such as N,N-dimethylformamide or N,N-dimethylacetamide; a sulfoxide, such as dimethyl sulfoxide; an alcohol, such as methanol or ethanol; or a polyhydric alcohol derivative, such as ethylene glycol monomethyl ether, ethylene glycol monomethyl ether acetate, or propylene glycol monomethyl ether acetate. These solvents may be used alone or in combination in the form of a mixed solvent, and the amount of solvent used may be appropriately selected.

(1.4) Conditions for Reaction

The molar ratio of the above monomers charged is selected so that the resultant copolymer has a copolymerization ratio of: (A) 25 to 90% by mole, (B) 0 to 65% by mole, (C) 0 to 65% by mole, and (D) 10 to 20% by mole, and that the copolymer has a proportion of an amount of unit structures containing an aromatic group based on a total amount of unit structures (A), (B), and (C) of 81 to 90% by mole. Here, (A) indicates a unit structure derived from a styrene compound containing a tert-butyl group; (B) indicates a unit structure derived from an aromatic group-containing vinyl compound containing no hydroxy group, which differs from unit structure (A); (C) indicates a unit structure derived from a compound containing (a)an (meth) acryloyl group and containing no hydroxy group; and (D) indicates a unit structure derived from a crosslink-forming group-containing compound. There is no particular limitation to the polymerization temperature in the present invention as long as the temperature is in such a range that a side reaction, such as a chain transfer reaction or a termination reaction, does not occur and the monomers are consumed to complete the polymerization. The polymerization is preferably conducted at a temperature not lower than −100° C. and not higher than the boiling point of the solvent. Also, there is no particular limitation to the concentration of monomers in the solvent. The monomer concentration is usually 1 to 40% by weight, preferably 10 to 30% by weight. The period of time for the polymerization reaction may be appropriately selected, but it falls usually within the range of from 2 to 50 hours.

(1.5) Copolymer

Thus, a copolymer suitably used in the present invention is obtained.

The weight average molecular weight of the copolymer, as measured by a GPC (gel permeation chromatography) method, may vary depending on, for example, the application solvent used and the solution viscosity. It is, for example, 1,000 to 50,000, preferably 2,000 to 20,000, in terms of a molecular weight determined using a conversion calibration curve obtained from the polystyrene.

(2) Preparation of the Composition

An additive is added to the thus obtained copolymer and the resultant mixture is dissolved in an appropriate solvent to obtain the underlayer film-forming composition m the present invention.

(2.1) Copolymer Component

Although a copolymer may be isolated from the above-obtained copolymer solution and then used in the preparation of an underlayer film-forming composition, the above-obtained copolymer solution may be used as such in the underlayer film-forming composition.

(2.2) Additives

The underlayer film-forming composition suitably used for the present invention may further contain a crosslinkable compound and a sulfonic acid compound. There is no particular limitation to the proportion of the sulfonic acid compound to the copolymer contained in the underlayer film-forming composition suitably used for the present invention. For example, the proportion of the sulfonic acid compound ranges from 0.1 to 13% by mass, preferably 0.5 to 5% by mass. The crosslinkable compound is also referred to as a crosslinking agent, and an example thereof is a nitrogen-containing compound having 2 to 4 nitrogen atoms, which is substituted with a methylol group or an alkoxymethyl group. There is no particular limitation to the proportion of the crosslinkable compound to the copolymer contained in the underlayer film-forming composition suitably used for the present invention. For example, the proportion ranges from 5 to 50% by mass.

Specific preferred examples of the sulfonic acid compounds include p-toluenesulfonic acid, 4-hydroxybenzenesulfonic acid, trifluoromethanesulfonic acid, pyridinium p-toluenesulfonate, pyridinium 4-hydroxybenzenesulfonate, camphorsulfonic acid, 5-sulfosalicylic acid, 4-chlorobenzenesulfonic acid, 4-hydroxybenzenesulfonic acid, benzenedisulfonic acid, 1-naphthalenesulfonic acid, and pyridinium 1-naphthalenesulfonate.

Specific preferred examples of the crosslinkable compounds (crosslinking agents) include hexamethoxymethylmelamine, tetramethoxymethylglycoluril, tetramethoxymethylbenzoguanamine, 1,3,4,6-tetrakis(methoxymethyl) glycoluril, 1,3,4,6-tetrakis(butoxymethyl)glycoluril, 1,3,4, 6-tetrakis(hydroxymethyl)glycoluril, 1,3-bis (hydroxymethyl)urea, 1,1,3,3-tetrakis(butoxymethyl)urea, and 1,1,3,3-tetrakis(methoxymethyl)urea, and more preferred is tetramethoxymethylglycoluril.

The sulfonic acid compound is an additive that functions as a crosslinking accelerator. In addition, 4-hydroxybenzenesulfonic acid (also called p-phenolsulfonic acid), for example, is an additive, which also suppresses the occurrence of footing of the resist pattern cross-section along the direction perpendicular to the substrate, to achieve a desired cross-section form (substantially rectangular form).

The underlayer film-forming composition suitably used for the present invention may contain a phenol derivative. The phenol derivative is an additive which, as does 4-hydroxybenzenesulfonic acid, suppresses the occurrence of footing of the resist pattern cross-section along the direction perpendicular to the substrate, to achieve a desired cross-section form (substantially rectangular form). Specific examples of phenol derivatives include 4-methylsulfonylphenol, bisphenol S, bisphenol AF, 4-cyanophenol, 3,4,5-trifluorophenol, 4-hydroxybenzotrifluoride, 2,3,5,6-tetrafluoro-4-(trifluoromethyl)phenol, and 2,6-dichloro-4-(methylsulfonyl)phenol. There is no particular limitation to the proportion of the phenol derivative to the copolymer contained in the underlayer film-forming composition of the present invention. For example, the proportion ranges from 0.1 to 20% by mass.

The underlayer film-forming composition suitably used for the present invention may contain a surfactant. The surfactant is an additive for improving the application properties to a substrate. A known surfactant, such as a nonionic surfactant or a fluorine surfactant, may be used. It may be added in an amount of, for example, 0.1 to 5% by mass based on the mass of the copolymer contained in the underlayer film-forming composition suitably used for the present invention.

In the underlayer film-forming composition suitably used for the present invention, when the component that would remain after removing the solvent from the composition is defined as solids, the solids include the copolymer and the above-mentioned various additives optionally added.

The concentration of the solid in the underlayer film-forming composition ranges, for example, from 0.1 to 15% by mass, preferably from 0.1 to 10% by mass.

(2.3) Solvent

Specific examples of solvents contained in the underlayer film-forming composition suitably used for the present invention include propylene glycol monomethyl (PGME), propylene glycol monomethyl ether acetate (PGMEA), propylene glycol monopropyl ether, methyl ethyl ketone, ethyl lactate, cyclohexanone, N,N-2-trimethylpropionamide, γ-butyrolactone, N-methylpyrrolidone, methyl 2-hydroxyisobutyrate, ethyl 3-ethoxypropionate, and mixtures of two or more solvents selected from these solvents. The solvent used in the preparation of the copolymer may be contained as such in the composition.

There is no particular limitation to the proportion of the solvent in the underlayer film-forming composition suitably used for the present invention. For example, the proportion is not lower than 90% by mass and not higher than 99.9% by mass.

(3) Step of Forming an Underlayer Film

An underlayer film is formed on the substrate in order to obtain neutral surface energy. The underlayer film-forming composition is applied onto the substrate by a method commonly used, such as spin coating, so that the resultant film has a predetermined, thickness, and, then, as occasion demands, subjected to, for example, heating or immersion.

The application of the underlayer film-forming composition suitably used for the present invention may be conducted by a method commonly used, and the composition may be applied by an appropriate application method, for example, using a spinner or a coater.

The obtained film applied is baked to form an underlayer film. Baking conditions are appropriately selected within the baking temperature range of 80 to 500° C., or 80 to 350° C. and within the baking time range of 0.3 to 60 minutes. Preferred conditions are at a baking temperature of 100 to 250° C. for a baking time of 0.5 to 2 minutes. The underlayer film formed has a thickness of, for example, 10 to 1,000 nm, or 20 to 500 nm, or 50 to 300 nm, or 100 to 200 nm, or 10 to 100 nm.

[2] Step of Forming Block Copolymer Layer

A block copolymer layer is formed on the underlayer film. The formation of the block copolymer layer may be conducted by a method commonly used, for example, by applying the self-organized film-forming composition containing a block copolymer onto the lower film layer by a method, such as spin coating, so that the resultant film has a predetermined thickness, followed by baking the film.

Thus, there is obtained an underlayer film for use in causing a layer comprising a block copolymer formed on a substrate to suffer phase separation.

[3] Step of Forming Upper Layer Film

Optionally, an upper layer film is formed on the above-obtained block copolymer layer. The formation of the upper layer film may be conducted by a well-known method, namely, application of an upper-layer film-forming composition onto the underlayer film followed by baking the film.

The upper-layer film-forming composition is applied onto the block copolymer layer by a method commonly used, such as spin coating, to form an upper layer film. The thickness of the formed upper layer film is not particularly limited, but generally falls within the range of from 3 to 100 nm, preferably from 10 to 70 nm, especially preferably from 20 to 60 nm. When the thickness of the upper layer film is 3 nm or less, a desired uniform block copolymer phase-separated pattern sometimes cannot be formed. When the thickness of the upper layer film is 100 nm or more, a considerably prolonged time is sometimes disadvantageously needed for etching. The upper-layer film-forming composition is preferably dissolved in a solvent or solvent mixture which does not damage the block copolymer, does not dissolve the block copolymer and does not substantially swell the block copolymer.0

The upper-layer film-forming composition which is suitable for practicing the present invention is described below.

[Upper-Layer Film-Forming Composition]

The upper-layer film-forming composition suitable for practicing the present invention is an upper-layer film-forming composition for use in causing a layer comprising a block copolymer formed on a substrate to suffer phase separation, wherein the upper-layer film-forming composition comprises, (A) a copolymer comprising (a) a unit structure derived from a maleimide structure and a unit structure derived from a styrene structure, and (B) an ether compound having 8 to 16 carbon atoms as a solvent.

This composition may be used as an upper-layer film-forming composition such that the composition is applied onto a block copolymer thin film to form an upper-layer film, and the resultant upper-layer film and the block copolymer thin film are heated to control the orientation of the block copolymer, followed by the removal of the upper layer film. A block copolymer layer which cannot be oriented merely by heating can be oriented by using an upper-layer film formed from this composition.

[(A) Copolymer]

[Copolymer Comprising (a) Unit Structure Derived from Maleimide Structure and Unit Structure Derived from Styrene Structure]

In the present description, the terms "maleimide structure" and "styrene structure" mean chemical structures having maleimide and styrene, respectively, as the skeleton. The wording "unit structure derived from" a maleimide structure or styrene structure means a repeating unit constituting the main chain of the copolymer, which is derived from a compound having the above-mentioned maleimide structure or styrene structure while maintaining the skeleton of the compound.

Preferably, the unit structure derived from a maleimide structure is represented by formula (1):

[Chemical formula 10]

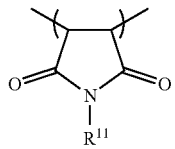

Formula (1)

wherein $R^{11}$ represents a hydrogen atom, a linear, branched, or cyclic alkyl group having 1 to 10 carbon atoms, or an aryl group having 6 to 10 carbon atoms optionally substituted with a halogen atom.

Preferably, the unit structure derived from a styrene structure is represented by formula (2):

[Chemical formula 11]

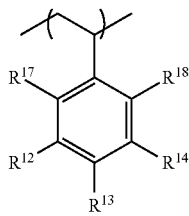

Formula (2)

wherein each of $R^{12}$ to $R^{14}$, $R^{17}$, and $R^{18}$ independently represents a hydrogen atom, an alkoxy group having 1 to 5 carbon atoms, or a linear, branched, or cyclic alkyl group having 1 to 10 carbon atoms optionally substituted with a halogen atom.

$R^{17}$ and $R^{18}$ are preferably a hydrogen atom.

Preferably, the molar ratios of the unit structures represented by formula (1) and formula (2) to the total unit structure in copolymer (A) are as follows:

structural unit of formula (1): 30 to 70% by mole, and structural unit of formula (2): 20 to 50% by mole, based on the total unit structures of copolymer (A).

[(b) Unit Structure Derived from (Meth)Acryl Group]

In addition to formula (1) and formula (2), copolymer (A) may further comprise (b) a unit structure derived from (a)an (meth)acryl group.

In the present invention, the "(meth)acryl group" means both an acryl group and a methacryl group. The "(meth) acrylate compound" means both an acrylate compound and a methacrylate compound. For example, (meth)acrylic acid means acrylic acid and methacrylic acid.

Preferably, the unit structure derived from (a)an (meth) acryl group is represented by formula (3):

[Chemical formula 12]

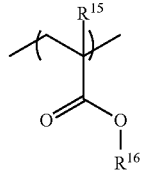

Formula (3)

wherein each of $R^{15}$ and $R^{16}$ independently represents a hydrogen atom, an alkoxy group having 1 to 5 carbon atoms, or a linear, branched, or cyclic alkyl group having 1 to 10 carbon atoms optionally substituted with a halogen atom.

The molar ratio of the unit structure of formula (3) to the total unit structures of copolymer (A) ranges from 0.1 to 50% by mole, more preferably from 0.1 to 30% by mole, further preferably from 0.1 to 20% by mole, most preferably from 0.1 to 10% by mole, based on the total unit structures of copolymer (A).

In formulae (1), (2), and (3) above, examples of aryl groups having 6 to 10 carbon atoms include a phenyl group, a benzyl group, and a naphthyl group.

There is no particular limitation to the manner of distribution of the unit structures represented by formulae (1), (2), and (3) in copolymer (A). Specifically, in copolymer (A), the unit structures represented by formulae (1) and (2) may be alternating-copolymerized or random-copolymerized. When the unit structure represented by formula (3) coexists, each of the unit structures represented by formulae (1), (2), and (3) in copolymer (A) may constitute blocks, or may be randomly bonded to each other.

The number of repetition of the unit structures represented by formulae (1), (2), and (3) in copolymer (A) may be appropriately selected so that the molar percentage of the unit structures falls within the above-mentioned range and that the weight average molecular weight Mw of copolymer (A) falls within the range of from 5,000 to 500,000, preferably from 10,000 to 100,000.

[Method for Producing Copolymer (A)]

A method for producing copolymer (A), which is suitable for practicing the present invention, comprises the step of subjecting a monomer mixture containing a compound represented by formula (4):

[Chemical formula 13]

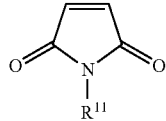

Formula (4)

wherein $R^{11}$ represents a hydrogen atom, a linear, branched, or cyclic alkyl group having 1 to 10 carbon atoms, or an aryl group having 6 to 10 carbon atoms optionally substituted with a halogen atom and
a compound represented by formula (5):

[Chemical formula 14]

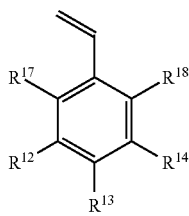

Formula (5)

wherein each of $R^{12}$ to $R^{14}$, and $R^{18}$ independently represents a hydrogen atom, an alkoxy group having 1 to 5 carbon atoms, or a linear, branched, or cyclic alkyl group having 1 to 10 carbon atoms optionally substituted with a halogen atom;
to copolymerization.
$R^{17}$ and $R^{18}$ are preferably a hydrogen atom.
Into the monomer mixture, a compound represented by formula (6):

[Chemical formula 15]

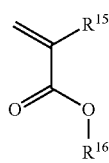

Formula (6)

wherein each of $R^{15}$ and $R^{16}$ independently represents a hydrogen atom, an alkoxy group having 1 to 5 carbon atoms, or a linear, branched, or cyclic alkyl group having 1 to 10 carbon atoms optionally substituted with a halogen atom
may optionally be incorporated.
The "alkyl group", "aryl group", "alkoxy group", and "halogen atom" are as described above.
The monomer mixture preferably contains the compounds represented by formula (4) and formula (5) in the following proportion:
the compound represented by formula (4): 30 to 70% by mole, and
the compound represented by formula (5): 20 to 50% by mole,
based on the total monomers for copolymer (A).
When a compound represented by formula (6) is incorporated, the monomer mixture preferably contains the compounds in the following proportion:
the compound represented by formula (4): 30 to 70% by mole,
the compound represented by formula (5): 20 to 50% by mole, and
the compound represented by formula (6): 0.1 to 40% by mole,
based on the total monomers for copolymer (A).
Specific examples of compounds represented by formula (4) include:

[Chemical formula 16]

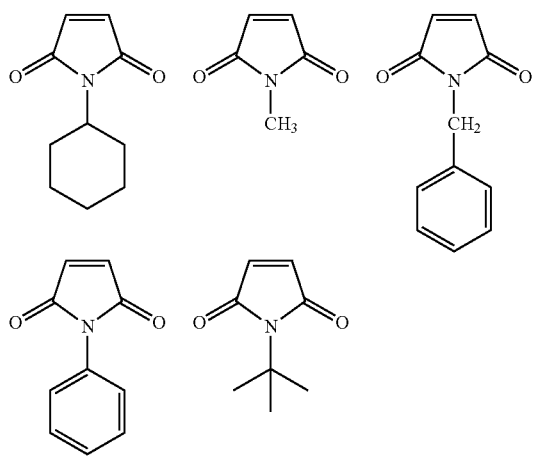

Specific examples of compounds represented by formula (5) include:

[Chemical formula 17]

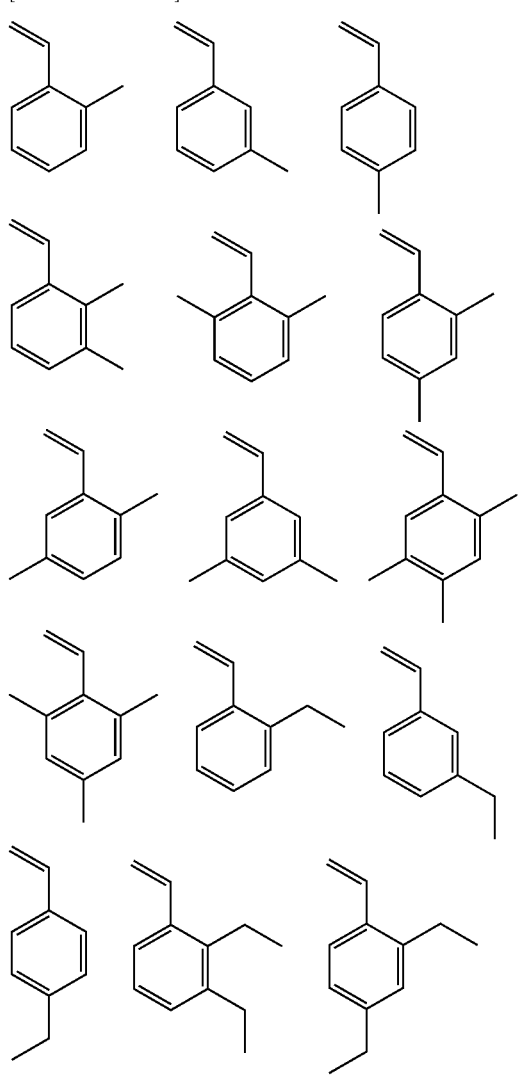

-continued
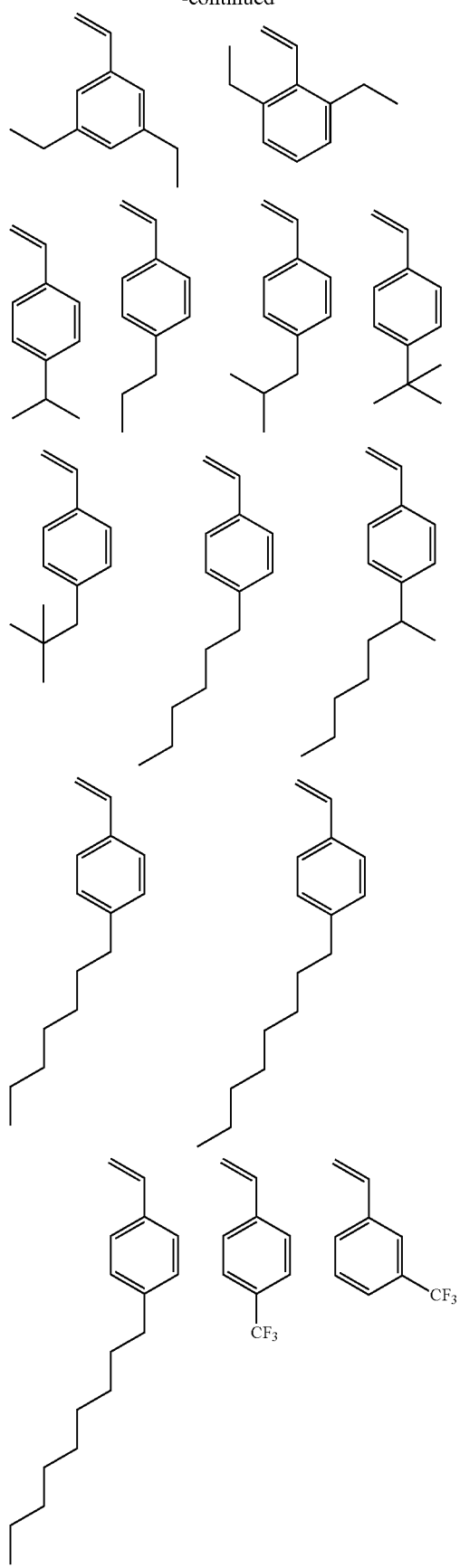
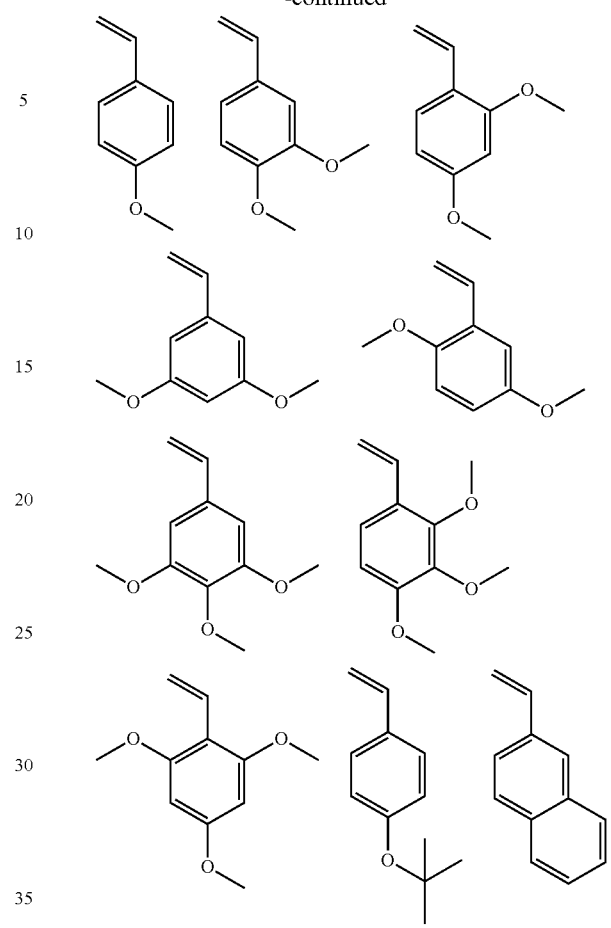
Specific examples of compounds represented by formula (6) include:
[Chemical formula 18]
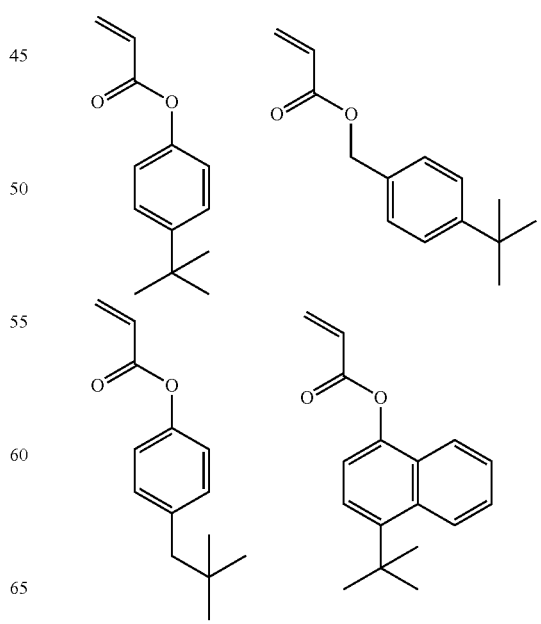

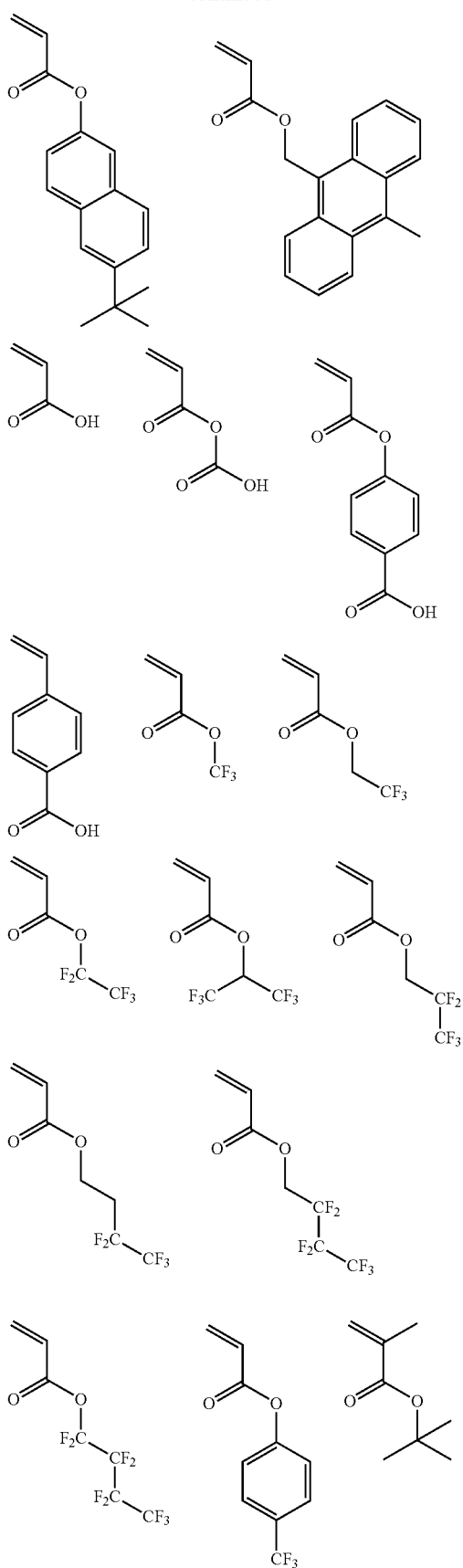
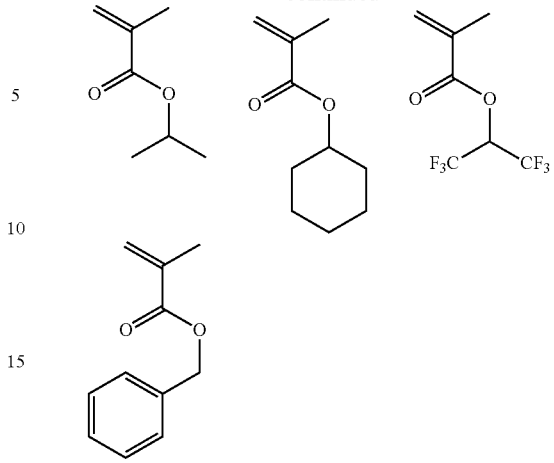

Copolymer (A) can be obtained by a known polymerization method. Examples of known polymerization methods include radical polymerization, anionic polymerization, and cationic polymerization. Various known techniques, such as solution polymerization, suspension polymerization, emulsion polymerization, and bulk polymerization, may be used.

As a polymerization initiator used in the polymerization, for example, 2,2'-azobis(isobutyronitrile), 2,2'-azobis(2-methylbutyronitrile), 2,2'-azobis(2,4-dimethylvaleronitrile), 4,4'-azobis(4-cyanovaleric acid), 2,2'-azobis(2,4-dimethyl-valeronitrile), 2,2'-azobis(4-methoxy-2,4-dimethylvaleronitrile), 2,2'-azobis(isobutyronitrile), 1,1'-azobis(cyclohexane-1-carbonitrile), 1-[(1-cyano-1-methylethyl)azo]formamide, 2,2'-azobis[2-(2-imidazolin-2-yl)propane] dihydrochloride, 2,2'-azobis[2-(2-imidazolin-2-yl)propane], or 2,2'-azobis(2-methylpropionamidine) methylpropionamidine) dihydrochloride is used.

As a solvent used in the polymerization, for example, dioxane, ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, or butyl lactate may be used. These may be used alone or in combination.

Copolymer (A) which is suitable for practicing the present invention may be obtained by conducting the reaction while stirring under reaction conditions at 50 to 200° C. for 1 to 48 hours.

The thus obtained solution containing copolymer (A) may be used as such in preparing an upper-layer film-forming composition. Alternatively, copolymer (A) may be isolated by precipitation in a poor solvent, such as methanol, ethanol, isopropanol, or water, or a mixed solvent thereof, followed by the recovy and used.

The isolated copolymer (A) may be redissolved as such in the below-mentioned ether compound having 8 to 16 carbon atoms, or may be dried and then used. When copolymer (A) is dried, it is preferably dried under the drying conditions, for example, in an oven at 30 to 100° C. for 6 to 48 hours. It may be possible to recover copolymer (A), dissolving it again in the below-mentioned ether compound having 8 to 16 carbon atoms to prepare a composition suitable for practicing the present invention, and using the composition as an upper-layer film-forming composition.

The weight average molecular weight of copolymer (A) suitable for practicing the present invention, as measured by a gel permeation chromatography (GPC) method, may vary depending on, for example, the application solvent used and the solution viscosity; however, it falls within the range of for example, from 5,000 to 500,000, preferably from 10,000 to 100,000, in terms of the molecular weight determined using a conversion calibration curve obtained from the polystyrene.

[(B) Solvent]

The solvent used in the composition suitable for practicing the present invention is an ether compound having 8 to 16 carbon atoms. More specifically, the ether compound having 8 to 16 carbon atoms used as the solvent in the composition suitable for practicing the present invention (hereinafter, sometimes referred to as "ether solvent") is represented by formula (7):

[Chemical Formula 19]

$$A_1\text{-}O\text{-}A_2 \quad \text{Formula (7)}$$

wherein each of $A_1$ and $A_2$ independently represents an optionally substituted linear, branched, or cyclic saturated alkyl group having 1 to 15 carbon atoms.

Of these, preferred solvents are dibutyl ether, diisobutyl ether, di-tert-butyl ether, dipentyl ether, diisoamyl ether, dihexyl ether, dioctyl ether, and cyclopentyl methyl ether, each having excellent balance between the solubility of copolymer (A) and the insolubility of the block copolymer which is suitable for practicing the present invention. Further preferred solvents are dibutyl ether, diisobutyl ether, and diisoamyl ether, and especially preferred is diisoamyl ether. These ether solvents may be used alone or in combination.

For example, for the convenience of the synthesis of copolymer (A) suitable for practicing the present invention, the above-mentioned ether solvent as well as an organic solvent below may be mixed into the composition. Such a solvent includes, for example, those mentioned above in the item for the method for producing copolymer (A). The solvent other than the ether solvent may be present in an amount of 0.01 to 13% by mass, based on the mass of the ether solvent.

[Additive]

The upper-layer film-forming composition suitable for practicing the present invention may further contain an additive, such as a surfactant or a rheology modifier.

If necessary, a rheology modifier, a surfactant and the like may be further added to the upper-layer film-forming composition suitable for practicing the present invention in addition to the above-mentioned components. The rheology modifier is added mainly for the purpose of improving the fluidity of the composition suitable for practicing the present invention. Specific examples of rheology modifiers include phthalate derivatives, such as dimethyl phthalate, diethyl phthalate, diisobutyl phthalate, dihexyl phthalate, and butylisodecyl phthalate; adipate derivatives, such as dinormalbutyl adipate, diisobutyl adipate, diisooctyl adipate, and octyldecyl adipate; maleate derivatives, such as dinormalbutyl maleate, diethyl maleate, and dinonyl maleate; oleate derivatives, such as methyl oleate, butyl oleate, and tetrahydrofurfuryl oleate; and stearate derivatives, such as normalbutyl stearate and glyceryl stearate. The rheology modifier is usually incorporated in an amount of less than 30% by mass, based on the mass of the composition suitable for practicing the present invention (100% by mass).

A surfactant may be incorporated into the upper-layer film-forming composition suitable for practicing the present invention for further improving the application properties to avoid surface unevenness and to prevent, for example, the occurrence of pinholes or striation. Examples of surfactants include nonionic surfactants, e.g., polyoxyethylene alkyl ethers, such as polyoxyethylene lauryl ether, polyoxyethylene stearyl ether, polyoxyethylene cetyl ether, and polyoxyethylene oleyl ether; polyoxyethylene alkylaryl ethers, such as polyoxyethylene octylphenol ether and polyoxyethylene nonylphenol ether; polyoxyethylene-polyoxypropylene block copolymers; sorbitan fatty acid esters, such as sorbitan monolaurate, sorbitan monopalmitate, sorbitan monostearate, sorbitan monooleate, sorbitan trioleate, and sorbitan tristearate; and polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine surfactants, such as EFTOP EF301, EF303, EF352 (manufactured by Tohchem Products Co., Ltd.), MEGAFACE F171, F173 (manufactured by DIC Corporation), Fluorad FC430, FC431 (manufactured by Sumitomo 3M), AsahiGuard AG710, Surflon S-382, SC101, SC102, SC103, SC104, SC105, SC106 (manufactured by Asahi Glass Co., Ltd.), and Ftergent Series (manufactured by NEOS Company Limited); and organosiloxane polymer KP341 (manufactured by Shin-Etsu Chemical Co., Ltd.). The surfactant is incorporated in an amount of usually 0.2% by mass or less, preferably 0.1% by mass or less, based on the mass of the upper-layer film-forming composition suitable for practicing the present invention (100% by mass). The surfactant may be added alone or in combination of two or more.

The amount of copolymer (A) contained in the composition, in terms of solid content, is preferably 20% by mass or more, for example, 20 to 100% by mass, or 30 to 100% by mass. The solid content of the composition suitable for practicing the present invention ranges preferably from 0.1 to 50% by mass, more preferably from 0.3 to 30% by mass. The solid content indicates the amount of solid left behind the removal of the solvent component from the upper-layer film-forming composition.

The above-mentioned copolymer (A), an ether compound having 8 to 16 carbon atoms as a solvent, and optionally the above additives are mixed according to the above-mentioned formulation and stirred at, for example, room temperature to 40° C. to produce the upper-layer film-forming composition suitable for practicing the present invention.

[4] Step of Causing the Block Copolymer Layer to Suffer Phase Separation

Phase separation of the block copolymer layer may be conducted in the presence of the upper layer film by a treatment that causes reorientation of the block copolymer material, for example, a treatment with ultrasonic waves, a treatment with a solvent, or heat annealing. In many uses, it is desirable that phase separation of the block copolymer layer is achieved merely by heating or by so-called heat annealing. The heat annealing may be conducted in the air or in an inert gas under atmospheric pressure or a reduced pressure or under pressuring conditions.

There is no particular limitation to the conditions for the heat annealing. The heat annealing may be conducted preferably in the air at 180 to 300° C., especially preferably at 190 to 240° C., most preferably at 210° C.

There is no particular limitation to the time for the treatment. It takes usually 1 to 30 minutes, preferably 3 to 10 minutes.

Phase separation of the block copolymer layer forms block copolymer domains oriented substantially vertically on the surface of the substrate or underlayer film. The form of the domains is, for example, a lamellar form, a spherical form, or a cylindrical form. A gap between the domains is, for example, 50 nm or less. By the method of the present invention, a structure having a desired size, form, orientation, and, periodic properties can be formed.

The upper layer film may be released after performing phase separation of the block copolymer layer. The release may be made using, for example, a solvent or solvent mixture (solvent for release) which does not damage the block copolymer, does not dissolve the block copolymer and does not substantially swell the block copolymer. The released upper layer film composition may be isolated and reused. The isolation may be conducted, for example, by a method commonly used, such as precipitation or distillation.

3. Method for Producing Semiconductor Device

The block copolymer layer phase-separated by the above-mentioned method may be further subjected to the step of etching the layer. Usually, before etching, part of the phase-separated block copolymer is removed. The etching may be conducted by a known means. This method may be used for producing a semiconductor substrate.

Thus, the method for producing a semiconductor device of the present invention comprises the steps of:

(1) forming a block copolymer layer on a substrate using the self-organized film-forming composition of the present invention, wherein the block copolymer is a block copolymer in which a silicon-non-containing polymer having as a structural unit styrene or a derivative thereof or a structure derived from a lactide and a silicon-containing polymer having as a structural unit styrene substituted with a silicon-containing group are bound;

(2) causing the block copolymer layer formed on the substrate to suffer phase separation;

(3) subjecting the phase-separated block copolymer layer to etching; and (4) subjecting the substrate to etching.

The method may further comprise the step of forming an underlayer film on the substrate before step (1).

Further, the method may further comprise the step of forming an upper layer film on the block copolymer layer between step (1) and step (2).

In the etching, for example, a gas of tetrafluoromethane ($CF_4$), perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride, chlorine trifluoride, chlorine, trichloroborane, or dichloroborane may be used. A halogen gas is preferably used, and a fluorine-based gas is more preferably used. Examples of fluorine-based gases include tetrafluoromethane ($CF_4$), perfluorocyclobutane ($C_4F_8$), perfluoropropane ($C_3F_8$), trifluoromethane, and difluoromethane ($CH_2F_2$).

By using the pattern of the phase-separated block copolymer layer formed using the upper-layer film-forming composition of the present invention, a desired form can be imparted to a substrate to be processed by etching, to produce an advantageous semiconductor device.

EXAMPLES

Hereinbelow, the present invention will be described in more detail with reference to the following Examples and Comparative Examples, which should not be construed as limiting the scope of the present invention.

The weight average molecular weight (Mw) of a polymer is the result of measurement by a gel permeation chromatography (GPC) method. In the measurement, a GPC apparatus, manufactured by Tosoh Corp., is used, and the conditions for the measurement are as follows.

Measuring apparatus: HLC-8020GPC [trade name] (manufactured by Tosoh Corp.)

GPC Columns: TSKgel G2000HXL: two columns; G3000HXL: one column; G4000HXL: one column [trade name] (all manufactured by Tosoh Corp.)

Column temperature: 40° C.

Solvent: Tetrahydrofuran (THF)

Flow rate: 1.0 ml/minute

Standard sample: Polystyrene (manufactured by Tosoh Corp.)

The solvents used in the following Examples are as follows.

Propylene glycol monomethyl ether acetate (boiling point: 146° C.)

n-Butyl acetate (boiling point: 126° C.)

N-Methylpyrrolidone (boiling point: 204° C.)

Diethylene glycol monomethyl ether (boiling point: 193° C.)

N,N-Dimethylisobutylamide (boiling point: 175° C.)

3-Methoxy-N,N'-dimethylpropanamide (boiling point: 215° C.)

Example 1

(Preparation of Self-Organized Film-Forming Composition)

1.00 g of a poly(4-methoxystyrene)/poly(4-trimethylsilylstyrene) copolymer (weight average molecular weight Mw: 30,200; polydisperse degree: 1.12; volume ratio: 50:50), which is a block copolymer, was dissolved in 48.755 g of propylene glycol monomethyl ether acetate and 0.245 g of N-methylpyrrolidone to obtain a 2% by mass solution. Then, the obtained solution was filtered using a polyethylene microfilter having a pore diameter of 0.02 µm to prepare solution 1 of a self-organized film-forming composition comprising a block copolymer.

(Preparation of Underlayer Film Composition)

0.45 g of a resin obtained from 4-tert-butylstyrene, 2-vinylnaphthalene, and 2-hydroxypropyl methacrylate (molar ratio: 30:55:15), 0.14 g of 1,3,4,6-tetrakis(methoxymethyl) glycoluril, and 0.01 g of pyridinium p-toluenesulfonate were dissolved in a mixed solvent of 139.58 g of propylene glycol monomethyl ether acetate and 59.82 g of propylene glycol monomethyl ether to obtain a 0.30% by mass solution. Then, the obtained solution was filtered using a polyethylene microfilter having a pore diameter of 0.2 µm to prepare a solution of an underlayer film-forming composition for a self-organized film.

(Preparation of Upper-Layer Film-Forming Composition)

0.25 g of a terpolymer obtained from N-cyclohexylmaleimide, 4-tert-butylstyrene, and tert-butyl methacrylate (molar ratio: 50:30:20) was dissolved in 9.75 g of diisoamyl ether to obtain a 2.5% by mass solution. Then, the obtained solution was filtered using a polyethylene microfilter having a pore diameter of 0.2 µm to prepare a solution of an upper-layer film-forming composition for a self-organized film.

(Evaluation of Self-Organization of the Self-Organized Film-Forming Composition)

The above-obtained underlayer film-forming composition was applied onto a silicon wafer, and heated on a hotplate at 240° C. for one minute to obtain an underlayer film (A layer). Solution 1 of a self-organized film-forming composition was applied onto the underlayer film by a spin coater, and heated on a hotplate at 100° C. for one minute to form a self-organized film (B layer) having a thickness of 40 nm. The upper-layer film-forming composition for a self-organized film was applied onto the self-organized film by a spinner, and then heated on a hotplate at 210° C. for 5 minutes to induce a micro-phase-separated structure in the block copolymer. FIG. 1 shows the arrangement of the layers.

(Observation of Micro-Phase-Separated Structure)

Figure 2:
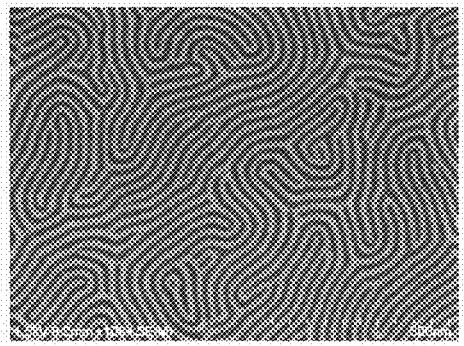
FIG. 2 A scanning, electron photomicrograph of a block copolymer layer formed using the self-organized film composition of the present invention (Example 1), in which excellent vertical lamellar orientation was made over the entire layer.

The silicon wafer having the micro-phase-separated structure induced was subjected to etching using an etching machine (Lam 2300 Versys Kiyo45), manufactured by Lam Research Corporation, and using $O_2$ gas as an etching gas for 30 seconds so that the upper layer film was removed and the polymethoxystyrene region was preferentially etched. Subsequently, the resultant topography was observed by an electron microscope (S-4800) (FIG. 2).

Examples 2 to 4

Preparation of samples (solutions 2 to 4) and formation of micro-phase-separated structures of block copolymer were conducted by repeating substantially the same procedures as in Example 1 except that N-methylpyrrolidone used as a high boiling-point solvent for the solution of the self-organized film-forming composition was replaced with each of diethylene glycol monomethyl ether, N,N-dimethylisobutylamide, and 3-methoxy-N,N'-dimethylpropanamide.

Example 5

Preparation of a sample (solution 5) and formation of a micro-phase-separated structure of block copolymer were conducted by repeating substantially the same procedures as in Example 1 except that a mixed solvent of 48.265 g of propylene glycol monomethyl ether acetate and 0.735 g of N-methylpyrrolidone was used as a solvent for the solution of the self-organized film-forming composition.

Examples 6 to 9

Preparation of samples (solutions 6 to 9) and formation of micro-phase-separated structures of block copolymer were conducted by repeating substantially the same procedures as in each of Examples 1 to 4 except that propylene glycol monomethyl ether acetate used as a low boiling-point solvent for the solution of the self-organized film-forming composition was replaced with n-butyl acetate.

Comparative Example 1

(Preparation of Self-Organized Film-Forming Composition)

1.00 g of a poly(4-methoxystyrene)/poly(4-trimethylsilylstyrene) copolymer (weight average molecular weight Mw: 30,200; polydisperse degree: 1.12; volume ratio: 50:50), which is a block copolymer, was dissolved in 50.00 g of propylene glycol monomethyl ether acetate to obtain a 2% by mass solution. Then, the obtained solution was filtered using a polyethylene microfilter having a pore diameter of 0.02 μm to prepare solution 10 of a self-organized film-forming composition comprising the block copolymer.

(Evaluation of Self-Organization of the Self-Organized Film-Forming Composition)

Preparation of a sample and formation of a micro-phase-separated structure of block copolymer were conducted by repeating substantially the same procedures as in Example 1 except that solution 1 of the self-organized film-forming composition was replaced with the above-mentioned solution 10.

Comparative Example 2

Preparation of a sample (solution 11) and formation of a micro-phase-separated structure of block copolymer were conducted by repeating substantially the same procedures as in Comparative Example 1 except that propylene glycol monomethyl ether acetate used as a solvent for the solution of the self-organized film-forming composition was replaced with n-butyl acetate.

Comparative Example 3

Preparation of a sample (solution 12) and formation of a micro-phase-separated structure of block copolymer were conducted by repeating substantially the same procedures as in Comparative Example 1 except that propylene glycol monomethyl ether acetate used as a solvent for the solution of the self-organized film-forming composition was replaced with 47.775 g of propylene glycol monomethyl ether acetate and 1.225 g of N-methylpyrrolidone.

Comparative Example 4

(Preparation of Self-Organized Film-Forming Composition)

1.00 g of a polystyrene/polymethyl methacrylate copolymer (weight average molecular weight Mw: 33,000; polydisperse degree: 1.08; volume ratio: 50:50), which is a block copolymer, was dissolved in 49.00 g of propylene glycol monomethyl ether acetate to obtain a 2% by mass solution. Then, the obtained solution was filtered using a polyethylene microfilter having a pore diameter of 0.02 μm to prepare solution 13 of a self-organized film-forming composition comprising a block copolymer.

(Preparation of Underlayer Film Composition)

0.45 g of a resin obtained from 2-vinylnaphthalene, benzyl methacrylate, and 2-hydroxypropyl methacrylate (molar ratio: 50:35:15), 0.14 g of 1,3,4,6-tetrakis(methoxymethyl)glycoluril, and 0.01 g of pyridinium p-toluenesulfonate were dissolved in a mixed solvent of 139.58 g of propylene glycol monomethyl ether acetate and 59.82 g of propylene glycol monomethyl ether to obtain a 0.30% by mass solution. Then, the obtained solution was filtered using a polyethylene microfilter having a pore diameter of 0.2 μm to prepare a solution, which is an underlayer film-forming composition for a self-organized film.

(Evaluation of Self-Organization of the Self-Organized Film-Forming Composition)

The above-obtained underlayer film-forming composition was applied onto a silicon wafer, and heated on a hotplate at 240° C. for one minute to obtain an underlayer film (A layer). Solution 13 of a self-organized film-forming composition was applied onto the underlayer film by a spin coater, and heated on a hotplate at 210° C. for 5 minutes to induce a micro-phase-separated structure in the block copolymer.

(Observation of Micro-Phase-Separated Structure)

The silicon wafer having the micro-phase-separated structure induced was subjected to etching using an etching machine (Lam 2300 Versys Kiyo45), manufactured by Lam Research Corporation, and using $O_2$ gas as an etching gas for 5 seconds so that the polymethyl methacrylate region was preferentially etched. Subsequently, the resultant topography was observed by an electron microscope (S-4800).

Comparative Example 5

Preparation of a sample (solution 13) and formation of a micro-phase-separated structure of block copolymer were conducted by repeating substantially the same procedures as in Comparative Example 4 except that the self-organized film-forming composition was heated at 180° C. for 5 minutes instead of at 210° C. for 5 minutes.

Comparative Example 6

Preparation of a sample (solution 14) and formation of a micro-phase-separated structure of block copolymer were conducted by repeating substantially the same procedures as in Comparative Example 4 except that propylene glycol monomethyl ether acetate used as a solvent for the solution of a self-organized film-forming composition was replaced with a mixed solvent of 0.245 g of N-methylpyrrolidone and 48.755 g of propylene glycol monomethyl ether acetate.

Comparative Example 7

Preparation of a sample (solution 14) and formation of a micro-phase-separated structure of block copolymer were conducted by repeating substantially the same procedures as in Comparative Example 6 except that the self-organized film-forming composition was heated at 180° C. for 5 minutes instead of at 210° C. for 5 minutes.

(Checking the Block Copolymer Orientation)

Figure 3:
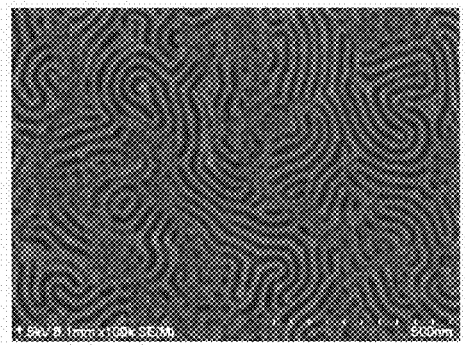
FIG. 3 A scanning electron photomicrograph of a block copolymer layer formed using the self-organized film composition (Comparative Example 1), in which defective orientation was partially caused in the horizontal lamellar orientation.
Figure 4:
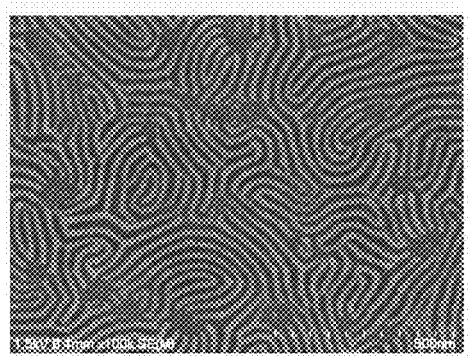
FIG. 4 A scanning electron photomicrograph of a block copolymer layer formed using the self-organized film composition (Comparative Example 3), in which defective orientation was partially caused in the horizontal lamellar orientation.

The crosslinking property of the underlayer films prepared above in Examples 1 to 9 and Comparative Examples 1 to 7, and the orientation of the block copolymers were checked. The results are shown in Table 1, FIG. 2 (vertical lamellar orientation over the entire block copolymer), and FIGS. 3 and 4 (partial vertical lamellar orientation).

TABLE 1

|  | Block copolymer | Solvent composition | Heating conditions | Compositional ratio | Block copolymer orientation |
|---|---|---|---|---|---|
| Example 1 | Poly(4-methoxystyrene)/ Poly(4-trimethylsilylstyrene) | PGMEA/NMP | 210° C./5 min | 99.5/0.5 | Vertical lamellar orientation (FIG. 2) |
| Example 2 | | PGMEA/Diethylene glycol monomethyl ether | | 99.5/0.5 | Vertical lamellar orientation |
| Example 3 | | PGMEA/Dimethylisobutylamide | | 99.5/0.5 | Vertical lamellar orientation |
| Example 4 | | PGMEA/3-Methoxy-N,N'-dimethylpropanamide | | 99.5/0.5 | Vertical lamellar orientation |
| Example 5 | | PGMEA/NMP | | 98.5/1.5 | Vertical lamellar orientation |
| Example 6 | | n-Butyl acetate/NMP | | 99.5/0.5 | Vertical lamellar orientation |
| Example 7 | | n-Butyl acetate/Diethylene glycol monomethyl ether | | 99.5/0.5 | Vertical lamellar orientation |
| Example 8 | | n-Butyl acetate/Dimethylisobutylamide | | 99.5/0.5 | Vertical lamellar orientation |
| Example 9 | | n-Butyl acetate/3-Methoxy-N,N'-dimethylpropanamide | | 99.5/0.5 | Vertical lamellar orientation |
| Comparative Example 1 | | PGMEA | | 100/0 | Defective orientation partially caused (FIG. 3) |
| Comparative Example 2 | | n-Butyl acetate | | 100/0 | Defective orientation partially caused |
| Comparative Example 3 | | PGEMA/NMP | | 97.5/2.5 | Defective orientation partially caused (FIG. 4) |
| Comparative Example 4 | Polystyrene/ Polymethyl methacrylate | PGMEA | 210° C./5 min | 100/0 | Vertical lamellar orientation |
| Comparative Example 5 | | PGMEA | 180° C./5 min | 100/0 | Defective orientation partially caused |
| Comparative Exampie 6 | | PGMEA/NMP | 210° C./5 min | 99.5/ 0.5 | Vertical lamellar orientation |
| Comparative Example 7 | | PGMEA/NMP | 180° C./5 min | 99.5/0.5 | Defective orientation partially caused |

In spite of at such a baking temperature that compositions containing a silicon-containing block copolymer, e.g., those containing poly(4-methoxystyrene) and poly(4-trimethylsilylstyrene), in a single solvent would have caused defective orientation, the self-organized film formed using the self-organized film compositions of the present invention allows the block copolymer over the entire coating film to become a micro-phase-separated structure perpendicular to a substrate, as can be seen from Table 1. Further, use of a block copolymer containing polystyrene and polymethyl methacrylate provided neither improvement of the orientation nor similar desirable result, even when a high boiling-point solvent was added.

INDUSTRIAL APPLICABILITY

By the present invention, it is possible to allow a layer containing a block copolymer to make a micro-phase-separated structure perpendicular to a substrate over the entire coating film without causing defective orientation in micro-phase separation of the block copolymer, and the present invention is extremely useful from an industrial point of view.

The invention claimed is:

1. A self-organized film-forming composition comprising a block copolymer, and at least two solvents having different boiling points as solvents,
    the block copolymer being a block copolymer in which a
        silicon-containing polymer having as a structural unit styrene substituted with a silicon-containing group and either a silicon-non-containing polymer having as a structural unit a structure derived from a lactide or a silicon-non-containing polymer having as a structural unit styrene optionally substituted with an organic group or a derivative thereof are bound, the solvents comprising a low boiling-point solvent (A) having a boiling point of not higher than 160° C. and a high boiling-point solvent (B) having a boiling point of not lower than 170° C.

2. The composition according to claim 1, wherein the high boiling-point solvent (B) is contained in an amount of 0.3 to 2.0% by weight, based on the total weight of the solvents contained in the composition.

3. A method for producing a phase-separated pattern of a block copolymer, comprising the steps of:
(1) forming a block copolymer layer on a substrate using the self-organized film-forming composition according to claim 1; and
(2) causing the block copolymer layer formed on the substrate to suffer phase separation,
wherein the block copolymer is a block copolymer in which a silicon-containing polymer having as a structural unit styrene substituted with a silicon-containing group and either a silicon-non-containing polymer having as a structural unit a structure derived from a lactide or a silicon-non-containing polymer having as a structural unit styrene optionally substituted with an organic group or a derivative thereof are bound.

4. The method according to claim 3, further comprising the step of forming an underlayer film on the substrate before step (1).

5. The method according to claim 3, further comprising the step of forming an upper layer film on the block copolymer layer between step (1) and step (2).

6. A method for producing a semiconductor device, comprising the steps of:
(1) forming a block copolymer layer on a substrate using the self-organized film-forming composition according to claim 1;
(2) causing the block copolymer layer formed on the substrate to suffer phase separation;
(3) subjecting the phase-separated block copolymer layer to etching; and
(4) subjecting the substrate to etching,
wherein the block copolymer is a block copolymer in which a silicon-containing polymer having as a structural unit styrene substituted with a silicon-containing group and either a silicon-non-containing polymer having as a structural unit a structure derived from a lactide or a silicon-non-containing polymer having as a structural unit styrene optionally substituted with an organic group or a derivative thereof are bound.

7. A method for causing a block copolymer to suffer self-organization using a self-organized film-forming composition which comprises:
a block copolymer in which a silicon-containing polymer having as a structural unit styrene substituted with a silicon-containing group and either a silicon-non-containing polymer having as a structural unit a structure derived from a lactide or a silicon-non-containing polymer having as a structural unit styrene optionally substituted with an organic group or a derivative thereof are bound; and
at least a low boiling-point solvent (A) having a boiling point of not higher than 160° C. and a high boiling-point solvent (B) having a boiling point of not lower than 170° C. as solvents.

8. A method for producing a phase-separated pattern of a block copolymer, comprising the steps of:
(1) forming a block copolymer layer on a substrate using the self-organized film-forming composition according to claim 2; and
(2) causing the block copolymer layer formed on the substrate to suffer phase separation,
wherein the block copolymer is a block copolymer in which a silicon-containing polymer having as a structural unit styrene substituted with a silicon-containing group and either a silicon-non-containing polymer having as a structural unit a structure derived from a lactide or a silicon-non-containing polymer having as a structural unit styrene optionally substituted with an organic group or a derivative thereof are bound.

9. The method according to claim 8, further comprising the step of forming an underlayer film on the substrate before step (1).

10. The method according to claim 8, further comprising the step of forming an upper layer film on the block copolymer layer between step (1) and step (2).

11. A method for producing a semiconductor device, comprising the steps of:
(1) forming a block copolymer layer on a substrate using the self-organized film-forming composition according to claim 2;
(2) causing the block copolymer layer formed on the substrate to suffer phase separation;
(3) subjecting the phase-separated block copolymer layer to etching; and
(4) subjecting the substrate to etching,
wherein the block copolymer is a block copolymer in which a silicon-containing polymer having as a structural unit styrene substituted with a silicon-containing group and either a silicon-non-containing polymer having as a structural unit a structure derived from a lactide or a silicon-non-containing polymer having as a structural unit styrene optionally substituted with an organic group or a derivative thereof are bound.

* * * * *

UNITED STATES PATENT AND TRADEMARK OFFICE
CERTIFICATE OF CORRECTION

PATENT NO. : 10,995,172 B2
APPLICATION NO. : 16/478018
DATED : May 4, 2021
INVENTOR(S) : Mizuochi et al.

Page 1 of 1

It is certified that error appears in the above-identified patent and that said Letters Patent is hereby corrected as shown below:

In the Specification

Column 15, Line 33, between "monomethyl" and "(PGME)" insert --ether--.

Column 24, Line 36, delete "methylpropionamidine)" second occurrence.

In Table 1, between Columns 31 and 32, delete "Comparative Exampie 6" and insert --Comparative Example 6--.

Signed and Sealed this
Seventeenth Day of August, 2021

Drew Hirshfeld
*Performing the Functions and Duties of the
Under Secretary of Commerce for Intellectual Property and
Director of the United States Patent and Trademark Office*